United States Patent
Schustereder et al.

(10) Patent No.: US 10,074,715 B2
(45) Date of Patent: Sep. 11, 2018

(54) SEMICONDUCTOR WAFER, IMPLANTATION APPARATUS FOR IMPLANTING PROTONS AND METHOD FOR FORMING A SEMICONDUCTOR DEVICE

(71) Applicant: Infineon Technologies Austria AG, Villach (AT)

(72) Inventors: Werner Schustereder, Villach (AT); Hans-Joachim Schulze, Taufkirchen (DE); Hans Weber, Bayerisch Gmain (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/259,446

(22) Filed: Sep. 8, 2016

(65) Prior Publication Data

US 2017/0069712 A1    Mar. 9, 2017

(30) Foreign Application Priority Data

Sep. 9, 2015 (DE) .................. 10 2015 115 173

(51) Int. Cl.
*H01L 29/06* (2006.01)
*C23C 14/48* (2006.01)
(Continued)

(52) U.S. Cl.
CPC .......... *H01L 29/0634* (2013.01); *C23C 14/48* (2013.01); *H01L 21/265* (2013.01); *H01L 21/324* (2013.01); *H01L 22/14* (2013.01)

(58) Field of Classification Search
CPC .......... H01L 21/02351; H01L 29/0852; H01L 29/086; H01L 29/0878; H01L 29/1054;
(Continued)

(56) References Cited

U.S. PATENT DOCUMENTS

| 4,472,871 A | * | 9/1984 | Green | ............. H01L 21/823412 257/392 |
| 5,914,499 A | * | 6/1999 | Hermansson | ....... H01L 21/0445 257/510 |

(Continued)

FOREIGN PATENT DOCUMENTS

| DE | 102014117700 A1 | 6/2015 |
| DE | 102015101736 A1 | 8/2015 |

OTHER PUBLICATIONS

Krueger, Christian et al., "Achieving Uniform Device Performance by Using Advanced Process Control and SuperScan", AIP Conference Proceedings 1321, Jun. 2010, Kyoto, Japan, pp. 123-126.

*Primary Examiner* — Jose R Diaz
(74) *Attorney, Agent, or Firm* — Murphy, Bilak & Homiller, PLLC

(57) ABSTRACT

A method for forming a semiconductor device includes determining at least one electrical parameter for each semiconductor device of a plurality of semiconductor devices to be formed in a semiconductor wafer. The method further includes implanting doping ions into device areas of the semiconductor wafer used for forming the plurality of semiconductor devices with laterally varying implantation doses based on the at least one electrical parameter of the plurality of semiconductor devices.

19 Claims, 4 Drawing Sheets

(51) Int. Cl.
*H01L 21/265* (2006.01)
*H01L 21/324* (2006.01)
*H01L 21/66* (2006.01)

(58) Field of Classification Search
CPC . H01L 29/1095; H01L 21/265; H01L 21/425; H01L 21/3223; H01L 21/76825; C23C 14/48

See application file for complete search history.

(56) References Cited

U.S. PATENT DOCUMENTS 7,208,330 B2 * 4/2007 Collins ............. H01L 21/26513
257/E21.135
2014/0001528 A1 1/2014 Pfirsch et al.

* cited by examiner

SEMICONDUCTOR WAFER, IMPLANTATION APPARATUS FOR IMPLANTING PROTONS AND METHOD FOR FORMING A SEMICONDUCTOR DEVICE

TECHNICAL FIELD

Embodiments relate to concepts for semiconductor device structures, and in particular to a semiconductor wafer, an implantation apparatus for implanting protons and a method for forming a semiconductor device.

BACKGROUND

It may be challenging to achieve doping accuracy in semiconductor technology. Doping inaccuracies or instability in doping regions may lead to deviations in electrical performance between semiconductor dies from different semiconductor wafers, and even between semiconductor dies from the same semiconductor wafer. For example, deviations or variations in the electrical characteristics (e.g. blocking capability) of semiconductor devices may exist between semiconductor devices on the same semiconductor wafer, for example.

SUMMARY

It is a demand to provide concepts for providing semiconductor devices with increased reliability.

Some embodiments relate to a method for forming a semiconductor device. The method comprises determining at least one electrical parameter for each semiconductor device of a plurality of semiconductor devices to be formed in a semiconductor wafer. The method further comprises implanting doping ions into device areas of the semiconductor wafer used for forming the plurality of semiconductor devices with laterally varying implantation doses based on the at least one electrical parameter of the plurality of semiconductor devices.

Some embodiments relate to a semiconductor wafer. The semiconductor wafer comprises a plurality of compensation devices. Each compensation device comprises a plurality of device drift regions having a first conductivity type and a plurality of compensation regions having a second conductivity type arranged alternatingly in a lateral direction. A breakdown voltage of more than 70% of the plurality of compensation devices varies by less than 10% from a nominal breakdown voltage of the plurality compensation devices.

Some embodiments relate to an implantation apparatus for implanting protons. The apparatus comprises a proton implantation module configured to implant protons into a semiconductor substrate. The apparatus further comprises a control module configured to control the implantations module to vary an implantation dose of protons laterally, so that protons are implanted with different implantation doses at different lateral portions of the semiconductor substrate.

Those skilled in the art will recognize additional features and advantages upon reading the following detailed description, and upon viewing the accompanying drawings.

BRIEF DESCRIPTION OF THE FIGURES

Some embodiments of apparatuses and/or methods will be described in the following by way of example only, and with reference to the accompanying figures, in which.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1A:
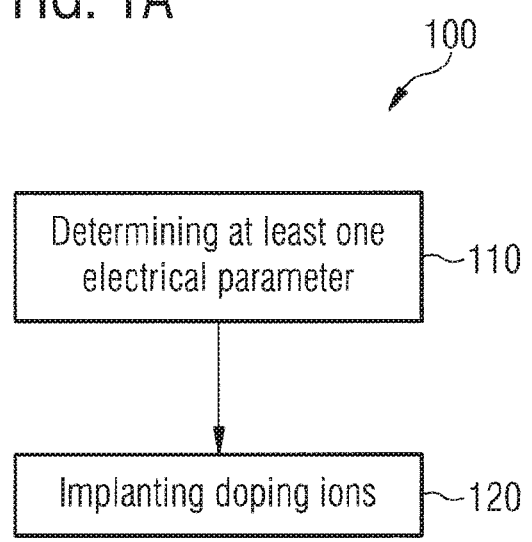
FIG. 1A shows a flow chart of a method for forming a semiconductor device.

FIG. 1A shows a flow chart of a method 100 for forming a semiconductor device according to an embodiment.

The method 100 comprises determining 110 at least one electrical parameter for each semiconductor device of a plurality of semiconductor devices to be formed in a semiconductor wafer.

The method further comprises implanting 120 doping ions into device areas of the semiconductor wafer used for forming the plurality of semiconductor devices with laterally varying implantation doses based on the at least one electrical parameter of the plurality of semiconductor devices.

Due to the implanting 120 of doping ions into the device areas of the semiconductor wafer with laterally varying implantation doses based on the at least one electrical parameter of the plurality of semiconductor devices to be formed, semiconductor devices which are more reliable may be provided. For example, a plurality of semiconductor devices to be formed within a semiconductor wafer may be provided with reduced deviations or inhomogeneity.

The method 100 may include determining 110 the at least one electrical parameter for each semiconductor device (e.g. each semiconductor die) of a plurality of semiconductor devices (or e.g. a plurality of semiconductor dies) to be formed in a semiconductor wafer by measuring a value of an electric parameter related to each semiconductor device of the plurality of semiconductor devices.

The method 100 may include determining 110 the at least one electrical parameter from partially formed or partially completed semiconductor devices, for example. For example, each semiconductor device may include one or more device doping regions. However, metallization layers or electrical interconnects may not yet be formed in the semiconductor devices.

The method 100 may include determining 110 the at least one electrical parameter of an electrical device structure formed in each (partially formed) semiconductor device of the plurality of semiconductor devices. The electric parameter may be, or may be a value corresponding to (or proportional to) a blocking voltage capability of the electrical device structure of a semiconductor device. For example, the electric parameter may correspond to a breakdown voltage Vbd (e.g. a blocking voltage capability) between a source and a drain of a field effect transistor (FET) device structure of the semiconductor device or between a collector and an emitter of an insulated gate bipolar transistor (IGBT) device structure of the semiconductor device, for example.

The electrical parameter (e.g. the breakdown voltage Vbd) may be measured between respective electrodes of the semiconductor device (or the electrical device structure) or with respect to a test structure arranged within an area of each semiconductor die (or semiconductor device) and/or within kerf regions of the semiconductor die. The test structures for monitoring process stability may be arranged in the kerf regions (e.g. the regions between the semiconductor dies which may be used for wafer dicing accomplished by scribing and breaking, by mechanical sawing or by laser cutting), for example. The test structures may include p-n junctions between several or any combination of p-doped regions and n-doped regions, for example. In additional or as an alternative, the test structures may also include resistors for monitoring sheet resistance of the p-doped regions and the n-doped regions. When arranging the test structures in the kerf regions, measurement of the test structures may be carried out before dicing the semiconductor wafer into singularized semiconductor devices (or dies), for example.

The electric parameter may characterize a charge balance of the electrical device structure (which may be e.g. a charge compensation device structure) of the semiconductor device with respect to a target value (e.g. with respect to a predefined nominal electrical parameter value). For example, since the charge balance constitutes a reference parameter for correction of an overall charge in the alternatingly doped compensation regions and drift regions (e.g. the n- and p-doped regions), precision of correction may be improved with respect to a correction process having the overall charge in the n- and p-doped regions as the reference parameter for correction. The adjusted implantation doses (e.g. proton irradiation parameters) may be configured to shift a charge balance of the individual charge compensation device structures in each semiconductor device towards or to a target charge balance of the charge compensation device structure based on the measured value of the electric parameter.

The value of the at least one electric parameter of the semiconductor devices may be measured by arranging the semiconductor wafer on a carrier and measuring the electric parameter via measurement equipment, for example. The measurement equipment may include a wafer prober, for example. For example, the semiconductor wafer may be vacuum-mounted on a wafer chuck and electrically connected via probes brought into electrical contact with the semiconductor wafer. When the electric parameter of a die (or a first semiconductor device) has been measured, the wafer prober moves the semiconductor wafer to the next die (or the next semiconductor device) and measurement of the electric parameter of the next die (or the next semiconductor device) may start, for example.

Optionally, more than one electrical parameter (or e.g. a blocking voltage or e.g. an electrical resistance) of the plurality of semiconductor devices may be determined. The laterally varying implantations doses may be determined based on more than one electrical parameter, for example.

Figure 1B:
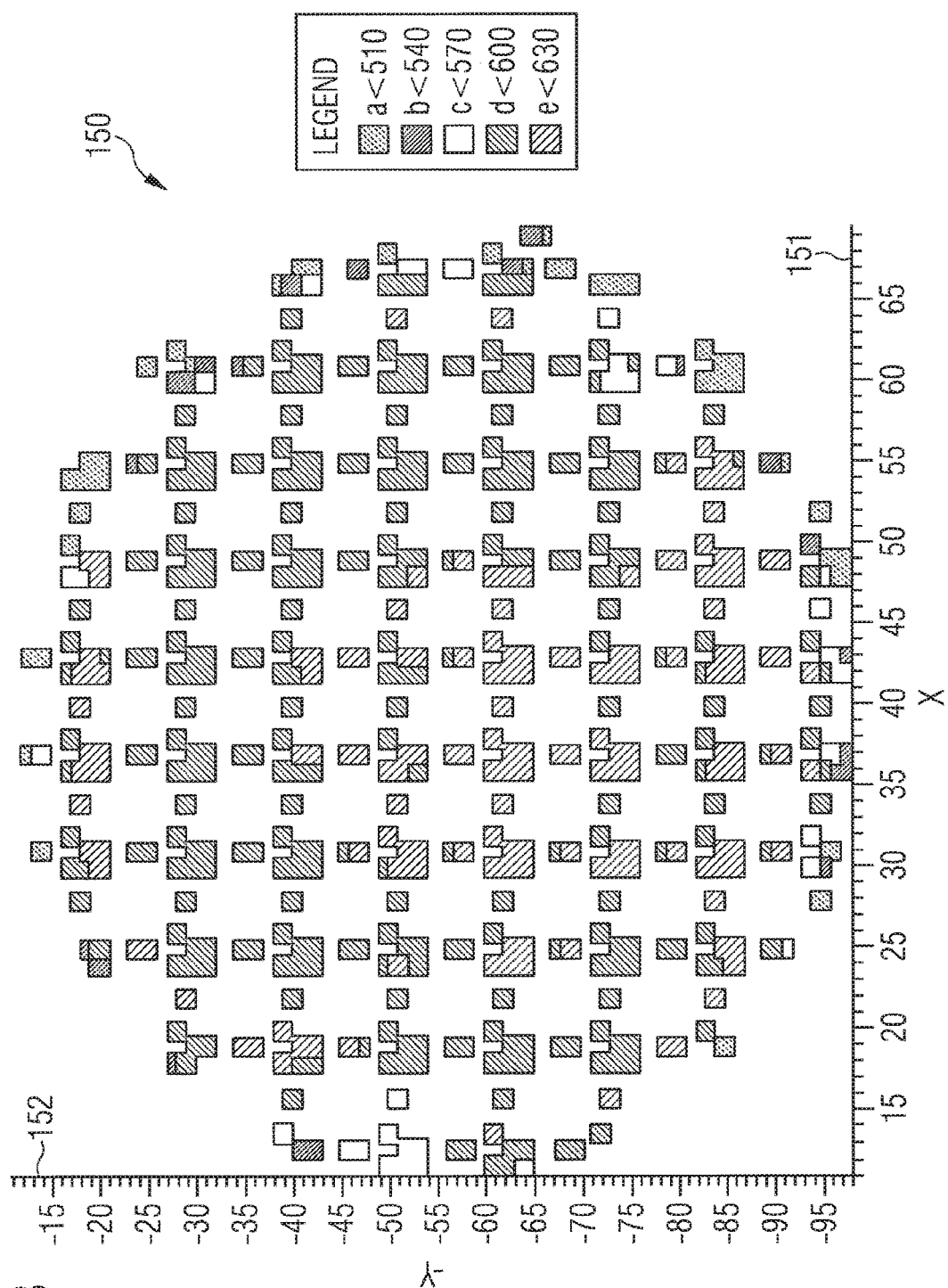
FIG. 1B shows a schematic illustration of a multi-chip layout of an electrical parameter of a plurality of semiconductor devices in a semiconductor wafer.

FIG. 1B shows an example of a wafer map 150 of a multi-chip layout of at least one electrical parameter (e.g. a break down voltage) for each semiconductor device of a plurality of semiconductor devices to be formed in a semiconductor wafer. The (partially formed or partially completed) semiconductor devices may each be arranged in different lateral locations with respect to a first lateral direction 151 (X) and a second lateral direction 152 (Y) of the semiconductor wafer. For example, the map may include information related to an inhomogeneous lateral distribution of the blocking capability in a compensations component with a nominal (target) breakdown voltage of 500 V. The map may include information related to a deviation of the measured electrical parameter (e.g. which may have a breakdown voltage range from 510 V and 630 V) corresponding to each semiconductor device from the target nominal electrical parameter value (e.g. 500V).

Based on the measured electric parameter values of the electrical device structures of the plurality of semiconductor devices, implantation doses (or e.g. proton irradiation doses) and/or annealing parameters for each semiconductor device (or e.g. for each electrical device structure) may be chosen or adjusted. For example, at least one of a dose and an energy of proton irradiation may be adjusted based on the measured value of the electric parameter.

The method 100 may include determining different implantation doses for implanting the doping ions into a device area of each semiconductor device of the plurality of semiconductor devices. For example, an implantations dose may be determined for each device area of the semiconductor device of the plurality of semiconductor devices, so that the electrical parameter of each semiconductor device may be individually adjusted. For example, each semiconductor device may be individually adjusted such that the electrical parameter is tuned towards the predefined nominal electrical parameter value (or target electrical parameter value). For example, the method 100 may include determining a first implantation dose for implanting the doping ions into a device area of the first semiconductor device of the plurality of semiconductor devices, and determining a second (different) implantation dose for implanting the doping ions into a device area of the second semiconductor device of the plurality of semiconductor devices.

The method 100 may include generating an implantation dose map comprising the plurality of laterally varying implantation doses to be implanted into the device areas of the plurality of semiconductor devices based on the measured electrical parameter value before implanting the doping ions into the device areas of the plurality of semiconductor devices, for example.

The adjusted implantation doses (e.g. proton irradiation parameters) may range between $1*10^{13}$ ions per cm$^2$ and $8*10^{14}$ ions per cm$^2$ (or e.g. between $5*10^{13}$ ions per cm$^2$ and $2*10^{14}$ ions per cm$^2$, or e.g. between $2*10^{14}$ ions per cm$^2$ and $8*10^{14}$ ions per cm$^2$), for example. The adjusted implantation energy may be greater than 30 keV (or e.g. greater than 300 keV), or may range between 30 keV and 5.0 MeV (or e.g. 1.0 MeV and 3.0 MeV), for example.

The doping ions may be protons, for example. Alternatively or optionally, the doping ions may include at least one ion type from the following group of ion types, the group of ion types consisting of: hydrogen ions, boron ions, phosphorus ions, aluminum ions, nitrogen ions, antimony ions, indium ions, gallium ions or arsenic ions.

Implanting 120 the doping ions into the device areas of the plurality of semiconductor devices with laterally varying implantation doses may mean that device areas of the different semiconductor devices in the semiconductor wafer are implanted with doping ions at different implantation doses. For example, instead of implanting the doping ions into the device areas of the plurality of semiconductor devices with a blanket (or uniform) implantations dose over the entire semiconductor wafer, each device area of the semiconductor device of the plurality of semiconductor devices may be implanted with doping ions at different implantation doses. For example, the doping ions may be implanted into a device area of the first semiconductor device of the plurality of semiconductor devices with a first implantation dose, and into a device area of the second (different) semiconductor device of the plurality of semiconductor devices with a second different implantation dose.

The method 100 may include implanting 120 the doping ions into a device area of at least one semiconductor device of the plurality of semiconductor devices to adjust the at least one electrical parameter related to the semiconductor device to vary by less than 10% (or e.g. by less than 5%, or e.g. less than 2%, or e.g. less than 1%) from a predefined nominal electrical parameter value. The predefined nominal electrical parameter value may be a targeted (or desired) value of the electrical parameter associated with the semiconductor device, for example. For example, the method 100 may include implanting 120 the doping ions into device areas of the semiconductor devices of the plurality of semiconductor devices such that the at least one electrical parameter of more than 70% (or e.g. more than 80% or e.g. more than 90%) of the semiconductor devices of the plurality of semiconductor devices are individually adjusted to vary by less than 10% (or e.g. by less than 5%, or e.g. less than 2%, or e.g. less than 1%) from the predefined nominal electrical parameter value.

The doping ions may be implanted into the device areas of the semiconductor devices with laterally varying implantation doses by varying a speed of motion, an angle and/or a distance of the semiconductor wafer with respect to an ion beam implanting the doping ions. For example, irradiation of the semiconductor wafer with adjusted proton irradiation parameters may generate hydrogen-related donors leading to an increase of n-doping in both the p- and n-doped regions of the charge compensation device structure of the plurality of semiconductor devices, for example.

A resulting donor concentration and vertical distribution may also be adjusted by an annealing temperature and an annealing duration. The method 100 may include further comprising annealing the semiconductor substrate after implanting the doping ions into the device areas of the plurality of semiconductor devices with laterally varying implantation doses. The annealing of the semiconductor substrate may be carried out at a temperature of between 300° C. and 550° C. (or e.g. between 380° C. and 500° C.) for between 0.5 hours and 10 hours (or e.g. between 1 hour and 5 hours), for example.

The doping is effected predominantly in the so-called end-of-range region of the ion (e.g. proton) implantation, and to a lesser extent in the region radiated through. Annealing of the semiconductor wafer may lead to diffusion of the hydrogen into the irradiated area and may also reach the surface radiated through whereby the formation of complexes comprising the hydrogen atoms and the irradiation-induced defects (e.g. vacancies results in the creation of donors, or e.g. so-called hydrogen-related donors) in this region.

Since at least one of the proton irradiation and annealing parameters are based on the measured value of the electric parameter related to the semiconductor devices, a precise correction process of charge balance in the n-doped and p-doped regions of the charge compensation device structure may be carried out with respect to an overall depth of a voltage absorbing volume of the charge compensation device structure (e.g. with respect to an overall depth of a drift zone of the charge compensation device). For example, the hydrogen-related donors may extend over at least 30% of a vertical extension of a drift zone between a first side and a second side of the semiconductor substrate. For example, a concentration of the hydrogen-related donors may be in a range of $5*10^{13}$ donor atoms per cm$^3$ and $8*10^{14}$ donor atoms per cm$^3$.

The above-described correction process may be repeated. For example, the electrical parameter for each semiconductor device of the plurality of semiconductor devices may be measured again (or repeatedly as desired). For example, depending on whether the measured electric parameter is out of a range of tolerance, proton irradiation and annealing may be carried out to increase the number of n-charges in the charge balance of the charge compensation device structure. For example, depending upon whether n-type charges or p-type charges dominate the charge balance of the charge compensation device structure, the correction process towards a target charge balance may either dispense with additional proton implantation and decrease the number of n-type charges in the charge compensation device structure by an additional annealing process of the semiconductor substrate or, in a case of excess p-type charges in charge compensation device structure, the number of n-type charges may be increased by additional proton implantation and annealing. Alternatively or optionally, annealing the semiconductor substrate may be carried out with a thermal budget configured to deactivate at least a part of donors generated by proton irradiation and annealing. Thereby, a concentration of hydrogen-related donors generated by proton irradiation and annealing may also be decreased.

By appropriately adjusting parameters such as proton irradiation dose, proton irradiation energy, annealing temperature and annealing duration, the end-of-range area of the doping profile may be adjusted to fall within a field stop zone of a charge compensation device, and the area of almost homogeneous doping with hydrogen-related donors may be adjusted to fall within a voltage absorbing region (e.g. a drift zone of a charge compensation device structure of a charge compensation device), for example.

The semiconductor wafer may be irradiated with the doping ions (e.g. protons) from a first lateral side, e.g. a front side of the semiconductor wafer. At the first lateral side, a control electrode (e.g. such as a gate electrode) may be arranged and electrically coupled to a wiring area. Additionally or optionally, the device areas of the semiconductor wafer may be implanted with the doping ions (e.g. the protons) from a second lateral side of the semiconductor wafer opposite to the first lateral side. At the second lateral side, a drain electrode of a (vertical) FET or a collector electrode of a (vertical) IGBT may be arranged. Alternatively or optionally, the semiconductor wafer may be irradiated with doping ions from the first lateral side and the second side.

The method 100 may include forming at least part of the electrical device structure (e.g. forming device doping regions of the electrical device structure) in each semiconductor device of the plurality of semiconductor devices before determining 110 the at least one electrical parameter for each semiconductor device of the plurality of semiconductor devices and before implanting 120 the doping ions into the device areas of the plurality of semiconductor devices with laterally varying implantation doses.

The electrical device structure in each semiconductor device may include a compensation device structure, for example. In a compensation device structure, the formed device doping regions of the semiconductor devices may include a plurality of drift regions having a first conductivity type (e.g. n-type doped regions) and a plurality of compensation regions having a second conductivity type (e.g. p-type doped regions) arranged alternatingly in a lateral direction, for example. A region comprising the first conductivity type may be a p-doped region (e.g. caused by incorporating aluminum ions or boron ions) or an n-doped region (e.g. caused by incorporating nitrogen ions, phosphor ions or arsenic ions). Consequently, the second conductivity type indicates an opposite n-doped region or p-doped region. In other words, the first conductivity type may indicate an p-doping and the second conductivity type may indicate a n-doping or vice-versa.

Each semiconductor device (or die) may include the charge compensation device structure including the alternating n-doped and p-doped regions alternating along a lateral direction (e.g. parallel to a main lateral surface of the semiconductor wafer), for example. The formed n-doped regions and the p-doped regions may extend in parallel as stripes in a direction orthogonal or perpendicular to the main lateral surface of the semiconductor wafer, for example. The p-doped regions may include separate p-doped pillars or islands surrounded by the n-doped region being a continuous n-doped region, for example. Alternatively of optionally, the n-doped regions may be separate n-doped pillars or islands surrounded by the p-doped region being a continuous p-doped region. A view of the p-doped islands or n-doped islands (from a cross-section parallel to the main lateral surface of the semiconductor wafer) may be square-shaped, rectangular, circular or polygonal, for example.

The device doping regions (e.g. the compensation regions and/or the drift regions) of the plurality of electrical device structures of the plurality of semiconductor devices in the semiconductor wafer may be formed within a trench and/or by ion implantation before implanting 120 the doping ions with laterally varying implantation doses. For example, device doping regions (e.g. the compensation regions and/or the drift regions) may be formed by a multi-epitaxial/multi-implant process or by a trench process, for example.

The formed device doping regions of the semiconductor device (e.g. of the compensation device structure) may further include at least one body region, at least one source region, and at least one drain region, for example. For example, the electrical device structure may include an optional (n-doped) field stop zone between the charge compensation regions and a (n+-doped) drain region. Additionally or optionally, each one of the compensation regions (e.g. p-doped regions) may adjoin a bottom side of a (p-doped) body region. Alternatively or optionally, the (p-doped) body region may be electrically coupled to a source/emitter contact structure at a first lateral side of the semiconductor wafer via an optional (p+-doped) body contact region. Additionally or optionally, (n+-doped) source regions may adjoin the first lateral side and may be electrically coupled to the source contact.

The formed electrical device structure may include a gate structure. The gate structure may include a gate dielectric and a gate electrode arranged on the semiconductor substrate at the first lateral side, which may be configured to control a conductivity in a channel region by field effect, for example. A current flow between the source contact at the first lateral side and a drain contact at a second lateral side 128 may be controlled by the gate structure, for example. The source and drain contacts may include conductive materials such as metal(s) and/or highly doped semiconductor materials. The source and drain contacts may be present before the determining 110 the at least one electrical parameter for each semiconductor device of the plurality of semiconductor devices and before implanting 120 the doping ions into the device areas of the plurality of semiconductor devices with laterally varying implantation doses. Alternatively or optionally, at least one of the source and drain contacts, e.g. the source contact and/or the drain contact may be formed after determining 110 the at least one electrical parameter for each semiconductor device of the plurality of semiconductor devices and after implanting 120 the doping ions into the device areas of the plurality of semiconductor devices with laterally varying implantation doses. For example, the method 100 may include forming the source/drain or emitter/collector contact structure on at least one side of the semiconductor wafer after implanting the doping ions into the device areas of the plurality of semiconductor devices.

Although the method 100 has been described with respect to a semiconductor device including a compensation device structure, it may be understood that the method 100 may be applied to semiconductor devices with other electrical device structures. For example, each semiconductor device may include at least one electrical device structure from the following group of electrical device structures. The group of electrical device structures may consist of: a metal oxide semiconductor field effect transistor device (MOSFET) structure, an insulated gate bipolar transistor device (IGBT) structure, a charge compensation transistor device structure, a diode device structure and a thyristor device structure. For example, each semiconductor device may include a vertical super-junction (SJ) n-channel field-effect transistor (NFET) device structure, a vertical SJ p-channel FET device structure, a lateral SJ FET device structure including source and drain contacts at a common side, or lateral or vertical insulated gate bipolar transistor (IGBT) device structures, for example.

Each semiconductor device may be a power semiconductor device having a breakdown voltage or blocking voltage of more than more than 10V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V or 2000V), for example.

The plurality of semiconductor devices (or semiconductor dies) may be located at different lateral portions of the semiconductor wafer. For example, the first semiconductor device and the second semiconductor device may be located at different lateral portions of the semiconductor wafer. For example, each semiconductor device of the plurality of semiconductor devices may be distally separated from each other semiconductor device by a separation distance in a lateral direction. The lateral direction may be substantially parallel to a lateral surface of the semiconductor wafer. For example, a lateral surface or a lateral dimension (e.g. a diameter or a length) of a main surface of the semiconductor structure may be more than 100 times larger (or more than 1000 times or more than 10000 times) than a distance between a first lateral surface of the semiconductor wafer and a second opposite lateral surface of semiconductor wafer, for example.

The plurality of semiconductor devices in the semiconductor wafer may refer more than one (or e.g. more than ten, or e.g. more than fifty, or e.g. more than hundreds of) semiconductor devices located in the semiconductor wafer.

Semiconductor devices such as compensation components may require a very accurate setting of doping levels (e.g. such as an accurate relationship between p doping regions and n doping regions) in order to obtain sufficient blocking capability. With method 100, doping accuracy may be improved from typical doping accuracy levels of lower than 1%. Deviations of electrical performance of each device from lot to lot and/or from wafer to wafer may be reduced, and unacceptable lateral variations in doping and unacceptable spreads in the blocking capability may be reduced. Method 100 may provide an improvement over a feed forward concept, which may be used to improve spreading from lot to lot and/or from wafer to wafer, but which may not allow lateral (doping) inhomogeneity in the wafer to be compensated, for example.

The method 100 may include manufacturing the compensation components using multi epitaxial concepts and/or trench concepts. Based on measurements of the compensation components, the lateral distribution of the doping values or doping ratios may be determined. Through the implantation of hydrogen over the whole surface, targeted donors in the drift zone of compensation components may be created. The incorporated dose may have a lateral variation to homogenize the previous doping values or doping ratios.

The method 100 may include irradiating the highly doped semiconductor wafer (or substrate) or the buffer epitaxial layer with a single, very high implantations energy, for example. Particularly if the annealing temperature and annealing time are high enough, an end of range peak may lie in the highly doped substrate or in the buffer epi layer. Annealing temperatures may lie between 450° C. and 500° C. and annealing times may lie between 1 h and 10 h, for example. With such temperature conditions, the implanted hydrogen may be redistributed, so that the donor complexes may be formed not only at the end-of range of the irradiation, but also in the irradiated area, whereby the donor complexes may include vacancies and hydrogen atoms.

The method 100 may include using different (or many) implantations energies to obtain a suitable depth distribution of donors. For example, (lower) annealing temperatures (e.g. between 380° C. and 470° C.), and (lower) annealing times (e.g. between 30 min and 5 hours) may be used. Particularly, the variation of the lateral dose and the implantations conditions may depend on the original doping values or doping ratios of the doping regions.

The lateral homogenization of the voltage yield (and/or other electrical parameter values), may allow more freedom in the manufacturing process of the components, such as, the use of a trench concept, or a reduction in the accuracy for the doping in the epitaxial layers, for example.

Figure 2:
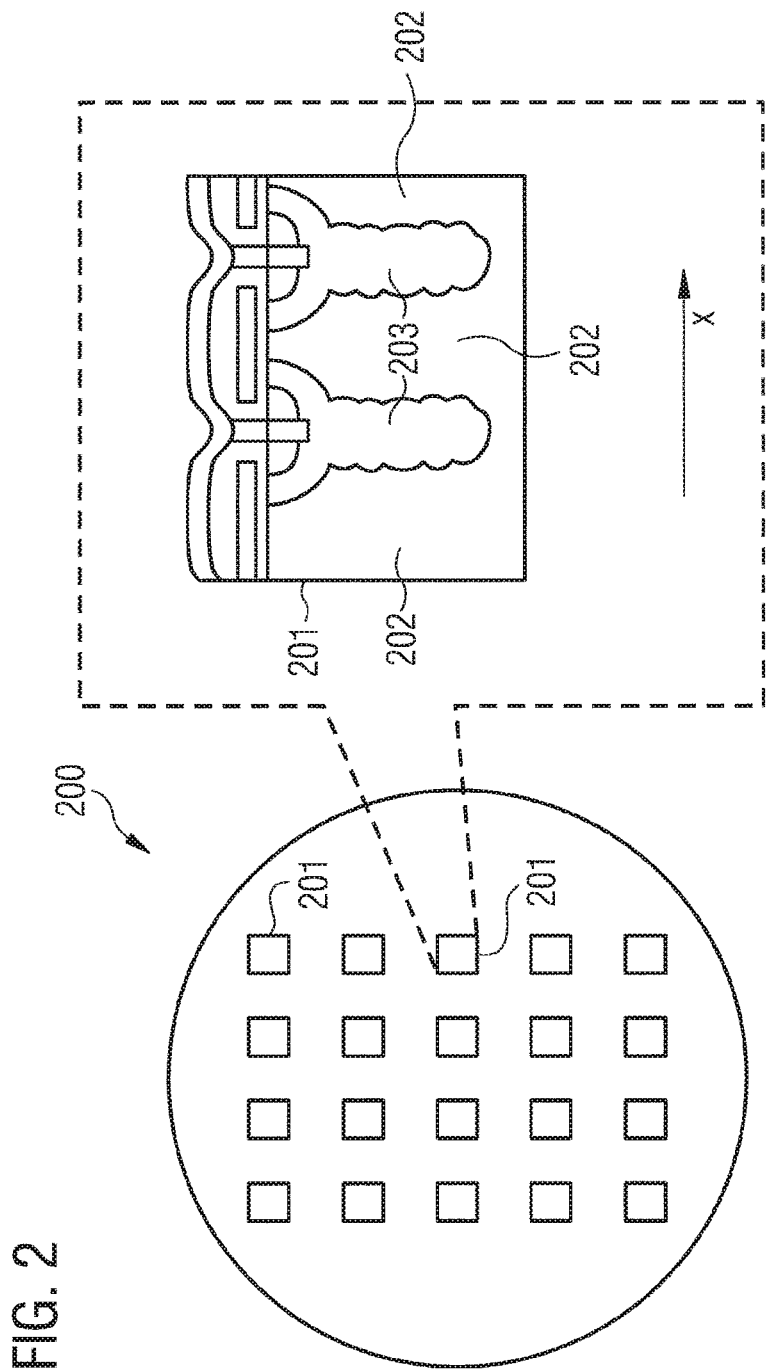
FIG. 2 shows a schematic illustration of a semiconductor wafer.

FIG. 2 shows a schematic illustration of a semiconductor wafer 200 according to an embodiment. The semiconductor wafer 200 comprises a plurality of compensation devices 201. Each compensation device 201 comprises a plurality of device drift regions 202 having a first conductivity type and a plurality of compensation regions 203 having a second conductivity type arranged alternatingly in a lateral direction, x.

A breakdown voltage of more than 70% of the plurality of compensation devices 201 varies by less than 10% from a nominal breakdown voltage of the plurality compensation devices 201.

Due to a breakdown voltage of more than 70% of the plurality of compensation devices 201 varying by less than 10% from a nominal breakdown voltage, a plurality of semiconductor devices within a semiconductor wafer may have reduced deviations or reduced inhomogeneity.

The breakdown voltage of more than 70% (or e.g. more than 80% or e.g. more than 90%) of the compensation devices of the plurality of compensation devices are individually adjusted to vary by less than 10% (or e.g. by less than 5%, or e.g. less than 2%, or e.g. less than 1%) from the nominal breakdown voltage.

Compensation devices may be based on mutual compensation of at least a part of the charge of n- and p-doped areas in the drift region of the vertical electrical element arrangement. For example, in a vertical transistor, p- and n-pillars or plates (plurality of strip shaped drift regions and plurality of strip-shaped cell compensation regions) may be arranged in pairs. For example, a strip-shaped cell compensation region 203 of the plurality of strip-shaped cell compensation regions 203 comprises a laterally summed number of dopants per unit area of the first conductivity type (p or n) deviating from half of a laterally summed number of dopants per unit area of the second conductivity type (n or p) comprised by two strip-shaped drift regions located adjacent to opposite sides of the strip-shaped cell compensation region by less than +/−25% (or less than 15%, less than +/−10%, less than +/−5%, less than 2% or less than 1%) of the laterally summed number of dopants per unit area of the first conductivity type comprised by the strip-shaped cell compensation region 203. The lateral summed number of dopants per unit area may be substantially constant or may vary for different depths. The lateral summed number of dopants per unit area may be equal or proportional to a number of free charge carriers within a strip-shaped cell compensation region 203 or a strip-shaped drift region 202 to be compensated in a particular depth, for example.

The plurality compensation regions 203 and the plurality of drift regions 202 may be stripe shaped. For example, the plurality compensation regions 203 and the plurality of drift regions 202 may have a vertical extension (e.g. vertical depth). In other words, the stripe-shaped cell compensation regions 203 may be laminar structures or may comprise the geometry of a wall or plate. The vertical extension may be larger than the lateral width and shorter than the lateral length. For example, the plurality of stripe-shaped cell compensation regions 203 may extend from the first lateral side surface of the semiconductor wafer into a depth of more than 10 μm (or more than 20 μm or more than 50 μm).

The stripe-shaped cell compensation regions 203 of the plurality of stripe-shaped cell compensation regions 203 may be arranged substantially in parallel to each other (e.g. neglecting manufacturing tolerances).

In a cross-section orthogonal to the lateral length of the stripe-shaped cell compensation structures 203, the stripe-shaped cell compensation regions 203 may comprise a pillar shape. The plurality of stripe-shaped cell compensation regions 203 may be arranged alternating to a plurality of stripe-shaped drift regions 202 of the vertical electrical element arrangement. In other words, a stripe-shaped drift region 202 of the vertical electrical element arrangement may extend into the semiconductor wafer between each two stripe-shaped cell compensation regions 203 within a cell region of a semiconductor device compensation device 201. The plurality of stripe-shaped drift regions 202 may comprise a second conductivity type.

Each compensation device may be a charge compensation transistor device. For example, each compensation device may be a MOSFET device or an IGBT device. For example, each compensation device may include a vertical super-junction (SJ) n-channel field-effect transistor (NFET), a vertical SJ p-channel FET, or a lateral SJ FET including source and drain contacts at a common side, or a lateral or vertical insulated gate bipolar transistors (IGBTs), for example.

Each compensation device may be a power semiconductor (transistor) device having a breakdown voltage or blocking voltage of more than more than 10V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V or 2000V).

The plurality of compensation devices in the semiconductor wafer may refer more than one (or e.g. more than ten, or e.g. more than fifty, or e.g. more than hundreds of) compensation devices located in the semiconductor wafer.

More details and aspects are mentioned in connection with the embodiments described above or below. The embodiments shown in FIG. 2 may comprise one or more optional additional features corresponding to one or more aspects mentioned in connection with the proposed concept or one or more embodiments described above (e.g. FIGS. 1A to 1B) or below (e.g. FIGS. 3A to 3B).

Figure 3A:
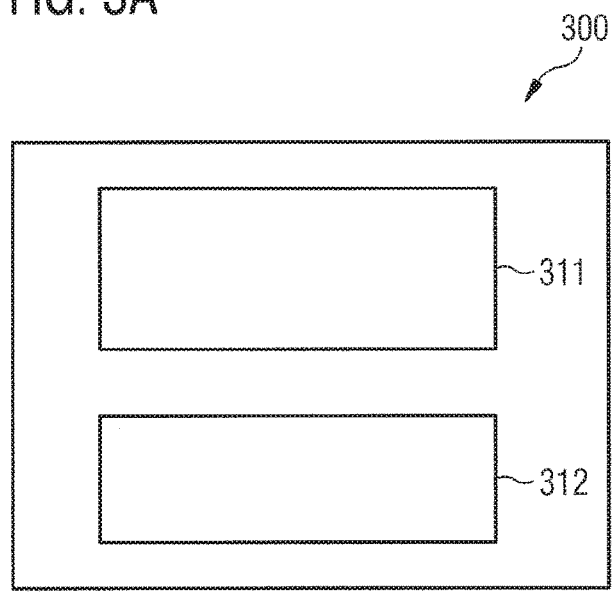
FIG. 3A shows a schematic illustration of an implantation apparatus for implanting protons.

FIG. 3A shows a schematic illustration of an implantation apparatus 300 for implanting protons. The apparatus 300 comprises a proton implantation module 311 configured to implant protons into a semiconductor substrate. The apparatus 300 further comprises a control module 312 configured to control the proton implantation module 311 to vary an implantation dose of protons laterally, so that protons are implanted with different implantation doses at different lateral portions of the semiconductor substrate.

Due to the control module 312 being configured to control the implantations module to vary an implantation dose of protons laterally, a plurality of semiconductor devices within a semiconductor wafer may be provided with reduced deviations or inhomogeneity.

The proton implantation module 311 may be configured to implant protons into the semiconductor substrate at an implantation dose in the range of $1*10^{11}$ ions per $cm^2$ and $5*10^{16}$ ions per $cm^2$ (or e.g. between $1*10^{13}$ ions per $cm^2$ and $8*10^{14}$ ions per $cm^2$, or e.g. between $5*10^{13}$ ions per $cm^2$ and $2*10^{14}$ ions per $cm^2$, or e.g. between $2*10^{14}$ ions per $cm^2$ and $8*10^{14}$ ions per $cm^2$). The proton implantation module may be configured to implant the protons into the semiconductor substrate at implantation energies of greater than 30 keV (or e.g. greater than 300 keV, or e.g. between 30 keV and 5.0 MeV, or e.g. between 1.0 MeV and 3.0 MeV), for example.

Figure 3B:
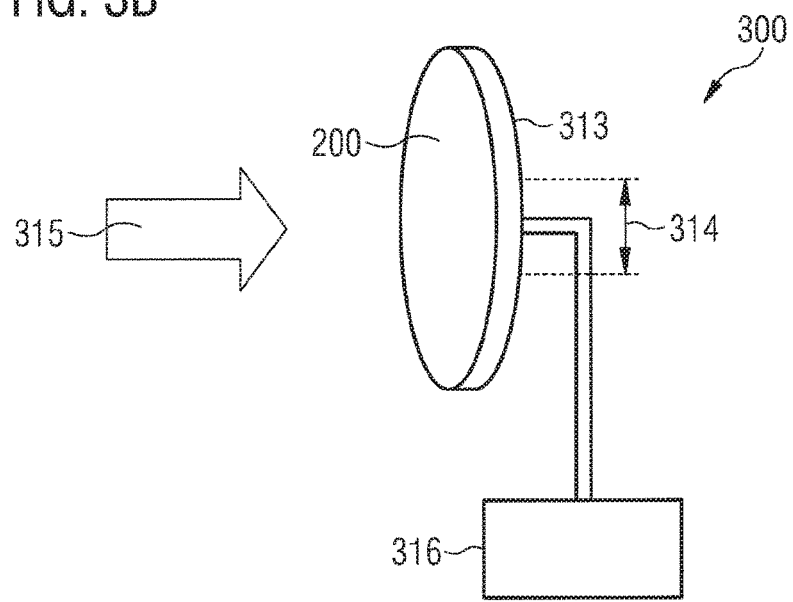
FIG. 3B shows a further schematic illustration of the implantation apparatus for implanting protons.

FIG. 3B shows a schematic illustration of the implantation apparatus 300 for implanting protons into a semiconductor wafer (or substrate) 200. The implantation apparatus 300 may include a robot 313 and a motor 316 configured to control a position of the semiconductor wafer 200. For example, the robot 313 and the motor 316 may be configured to control a direction of travel 314 of the semiconductor wafer 200, in a direction substantially parallel to a lateral surface of the semiconductor wafer, and/or such that the position of the semiconductor wafer 200 may be varied with respect to the main beam direction of the ion beam 315 of doping ions. For example, the robot 313 and the motor 316 may be configured to control the position of the semiconductor wafer 200 such that the ion beam 315 may enter the semiconductor wafer 200 at different lateral positions on the lateral side surface of the semiconductor wafer 200.

The control module 312 may be configured to control the proton implantation module 311 to vary an implantation dose of protons laterally based on the measured electrical parameter values of the electrical device structure in each semiconductor device in the semiconductor wafer. The control module 312 may be configured to control the proton implantation module 311 to vary the implantation doses (or e.g. proton irradiation doses) and/or annealing parameters for each semiconductor device, for example. For example, the control module 312 may be configured to control the proton implantation module 311 to vary at least one of a dose and an energy of proton irradiation based on the measured electrical parameter values of the plurality semiconductor devices in the semiconductor substrate.

The implantation apparatus 300 may be used as part of a feed forward method or concept to homogenize the doping levels (or doping ratios between p-doping regions and n-doping regions) in compensations components, and/or to increase the voltage yield over a chip and/or to simplify the process for forming semiconductor devices.

The adaptation of the lateral distribution of the implantations dose may take place by sweeping the wafer with ion beams during implantation. Through variation of the scanning speed of the wafer through the beams and/or the speed of the sweeps of the beams over the wafer, a pattern with different doses may be implanted. Additionally or optionally, the wafer may be rotated on the plate such that the ion beam 315 (with different lateral doses) may enter the semiconductor wafer 200 at different lateral positions on the lateral side surface of the semiconductor wafer 200, for example. Additionally or optionally, the wafer may be vertically (or horizontally) moved, and the ion beam may be scanned horizontally (or vertically) such that the ion beam 315 (with different lateral doses) may enter the semiconductor wafer 200 at different lateral positions on the lateral side surface of the semiconductor wafer 200. Through the variation of the x-y movement of the semiconductor wafer, higher or lower doses may be implanted locally or in different lateral locations of the semiconductor wafer. For example, inhomogeneous implantation (or unsymmetrical dose patterns) may be carried out in target areas of the wafer. For example, defined areas may have higher or lower doses as others. For example, off-center patterns and/or non-circular patterns may be implemented and complex pattern with laterally varying implantation doses may be generated to control an a lateral doping profiles and the lateral distribution of doping ratios.

Although the movement of the semiconductor wafer with respect to ion beam is described, it may be understood that additionally or optionally, a position of the ion beam with respect to the semiconductor wafer such that the ions may be implanted at different lateral positions of the semiconductor wafer 200.

More details and aspects are mentioned in connection with the embodiments described above or below. The embodiments shown in FIGS. 3A and 3B may comprise one or more optional additional features corresponding to one or more aspects mentioned in connection with the proposed concept or one or more embodiments described above (e.g. FIGS. 1A to 2) or below.

Various examples relate to a method for increasing the doping efficiency of a proton implantation and/or for partially influencing a proton doping profile, for example.

Aspects and features (e.g. the semiconductor wafer, the at least one electrical parameter, the semiconductor device, the electrical device structure, the doping ions, the laterally varying implantation doses, the device doping regions, the implantation apparatus, the proton implantation module, the control module and the compensation devices) mentioned in connection with one or more specific examples may be combined with one or more of the other examples.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for forming a semiconductor device, the method comprising:
   determining at least one electrical parameter for each semiconductor device of a plurality of semiconductor devices to be formed in a semiconductor wafer; and
   implanting doping ions into device areas of the semiconductor wafer used for forming the plurality of semiconductor devices with laterally varying implantation doses based on the at least one electrical parameter of the plurality of semiconductor devices,
   wherein the at least one electrical parameter is an electrical breakdown voltage of at least one semiconductor device of the plurality of semiconductor devices.

2. The method of claim 1, wherein the doping ions are implanted into a device area of a first semiconductor device of the plurality of semiconductor devices with a first implantation dose, and into a device area of a second semiconductor device of the plurality of semiconductor devices with a second different implantation dose, wherein the first semiconductor device and the second semiconductor device are located at different lateral portions of the semiconductor wafer.

3. The method of claim 1, wherein the doping ions are implanted into a device area of at least one semiconductor device of the plurality of semiconductor devices to adjust the at least one electrical parameter related to the semiconductor device to vary by less than 10% from a predefined nominal electrical parameter value.

4. The method of claim 1, wherein the doping ions are implanted into the device areas of the semiconductor devices of the plurality of semiconductor devices such that the at least one electrical parameter of more than 70% of the semiconductor devices of the plurality of semiconductor devices are individually adjusted to vary by less than 10% from a predefined nominal electrical parameter value.

5. The method of claim 1, wherein the doping ions are implanted into the device areas of the semiconductor devices with laterally varying implantation doses of between $1*10^{13}$ ions per cm$^2$ and $8*10^{14}$ ions per cm$^2$.

6. The method of claim 1, wherein the doping ions are protons.

7. The method of claim 1, wherein the doping ions are implanted into the device areas of the semiconductor devices with laterally varying implantation doses by varying a speed of motion, an angle, or a distance of the semiconductor wafer with respect to an ion beam implanting the doping ions.

8. The method of claim 1, further comprising forming device doping regions of an electrical device structure in each device area of the plurality of semiconductor devices before implanting the doping ions into the device areas of the plurality of semiconductor devices with laterally varying implantation doses.

9. The method of claim 8, wherein the device doping regions are formed in the semiconductor wafer within a trench and/or by ion implantation before implanting the doping ions.

10. The method of claim 8, wherein the device doping regions comprise a plurality of drift regions having a first conductivity type and a plurality of compensation regions having a second conductivity type arranged alternatingly in a lateral direction.

11. The method of claim 1, further comprising forming a source/drain or emitter/collector contact structure on at least one side of the semiconductor wafer after implanting the doping ions into the device areas of the plurality of semiconductor devices.

12. The method of claim 1, further comprising annealing the semiconductor wafer after implanting doping ions into the device areas of the plurality of semiconductor devices with laterally varying implantation doses.

13. The method of claim 12, wherein the semiconductor wafer is annealed at a temperature of between 380° C. and 500° C.

14. The method of claim 12, wherein the semiconductor wafer is annealed for between 0.5 hours and 10 hours.

15. The method of claim 1, wherein each semiconductor device to be formed comprises at least one electrical device structure from the following group of electrical device structures, the group of electrical device structures consisting of: a metal oxide semiconductor field effect transistor device structure; an insulated gate bipolar transistor device structure; a charge compensation transistor device structure; a diode structure; and a thyristor structure.

16. The method of claim 1, wherein each semiconductor device to be formed has a blocking voltage of greater than 10 V.

17. An implantation apparatus for implanting protons, the apparatus comprising:
   a proton implantation module configured to implant protons into a semiconductor substrate; and
   a control module configured to control the proton implantation module so as to vary an implantation dose of protons laterally based on a measured electrical parameter value of a semiconductor device in the semiconductor substrate, such that the protons are implanted with different implantation doses at different lateral portions of the semiconductor substrate,
   wherein the measured electrical parameter value is an electrical breakdown voltage of the semiconductor device.

18. The implantation apparatus of claim 17, wherein the proton implantation module is configured to implant the protons into the semiconductor substrate at implantation energies of greater than 300 keV.

19. A semiconductor wafer, comprising:
   a plurality of compensation devices, wherein each compensation device comprises a plurality of device drift regions having a first conductivity type and a plurality of compensation regions having a second conductivity type arranged alternatingly in a lateral direction,
   wherein a breakdown voltage of more than 70% of the plurality of compensation devices varies by less than 10% from a nominal breakdown voltage of the plurality compensation devices.

* * * * *